(12) United States Patent
Choi et al.

(10) Patent No.: US 11,723,231 B2
(45) Date of Patent: Aug. 8, 2023

(54) DISPLAY DEVICE WITH PATTERNED ORGANIC FILM AT METAL WIRING OVERLAP IN DISPLAY AREA

(71) Applicant: SAMSUNG DISPLAY CO., LTD., Yongin-si (KR)

(72) Inventors: Kyunghyun Choi, Yongin-si (KR); Jinkoo Chung, Yongin-si (KR); Mihae Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 339 days.

(21) Appl. No.: 17/099,978

(22) Filed: Nov. 17, 2020

(65) Prior Publication Data

US 2021/0280829 A1    Sep. 9, 2021

(30) Foreign Application Priority Data

Mar. 6, 2020   (KR) .................. 10-2020-0028625

(51) Int. Cl.
| | |
|---|---|
| *H10K 50/844* | (2023.01) |
| *H10K 59/123* | (2023.01) |
| *H10K 59/124* | (2023.01) |
| *H10K 59/131* | (2023.01) |
| *H10K 59/121* | (2023.01) |

(52) U.S. Cl.
CPC ....... *H10K 50/8445* (2023.02); *H10K 59/123* (2023.02); *H10K 59/124* (2023.02); *H10K 59/1213* (2023.02); *H10K 59/131* (2023.02)

(58) Field of Classification Search
CPC ............. H01L 51/5256; H01L 27/3248; H01L 27/3258; H01L 27/3262; H01L 27/3276; H10K 50/8445; H10K 59/131; H10K 59/1213; H10K 59/124; H10K 59/123
See application file for complete search history.

(56) References Cited

U.S. PATENT DOCUMENTS

| | | | |
|---|---|---|---|
| 7,915,821 B2 * | 3/2011 | Kang ................. | H01L 51/5237 313/506 |
| 8,513,070 B2 | 8/2013 | Park et al. | |

(Continued)

FOREIGN PATENT DOCUMENTS

| | | |
|---|---|---|
| KR | 100611768 B1 | 8/2006 |
| KR | 1020180013452 A | 2/2018 |

(Continued)

*Primary Examiner* — Lex H Malsawma
(74) *Attorney, Agent, or Firm* — Cantor Colburn LLP

(57) ABSTRACT

A display device includes a substrate including a display area and a peripheral area, a thin film transistor arranged on the substrate, a first metal wiring layer electrically connected to the thin film transistor, an inorganic protective layer on the first metal wiring layer, a patterned first organic film layer located on the inorganic protective layer and overlapping the first metal wiring layer in a plan view, a second metal wiring layer on the first organic film layer, and a second organic film layer on the second metal wiring layer, where the first organic film layer is patterned to be arranged at a position where the first metal wiring layer and the second metal wiring layer overlap each other in the plan view, and is not arranged on an entirety of the display area, and the second organic film layer is arranged on the entire display area.

20 Claims, 9 Drawing Sheets

(56) References Cited

U.S. PATENT DOCUMENTS

| | | | |
|---|---|---|---|
| 10,439,165 B2 | 10/2019 | Kim et al. | |
| 10,573,704 B2* | 2/2020 | Cai | H01L 27/3262 |
| 10,644,097 B2 | 5/2020 | Lee et al. | |
| 2003/0057419 A1* | 3/2003 | Murakami | G02F 1/13454 |
| | | | 257/E27.111 |
| 2018/0145125 A1* | 5/2018 | Lee | H01L 51/0097 |
| 2019/0041915 A1* | 2/2019 | Park | H01L 27/3276 |
| 2019/0164995 A1* | 5/2019 | Lee | H01L 27/1262 |
| 2020/0286976 A1* | 9/2020 | Noh | H01L 27/3276 |

FOREIGN PATENT DOCUMENTS

| | | |
|---|---|---|
| KR | 101860861 B1 | 5/2018 |
| KR | 1020180078830 A | 7/2018 |
| KR | 1020180134638 A | 12/2018 |

\* cited by examiner

DISPLAY DEVICE WITH PATTERNED ORGANIC FILM AT METAL WIRING OVERLAP IN DISPLAY AREA

This application claims priority to Korean Patent Application No. 10-2020-0028625, filed on Mar. 6, 2020, and all the benefits accruing therefrom under 35 U.S.C. § 119, the content of which in its entirety is herein incorporated by reference.

BACKGROUND

1. Field

One or more embodiments relate to a display device.

2. Description of the Related Art

In general, a display device has a configuration including various stacked layers. For example, an organic light-emitting display device includes an organic light-emitting device. The organic light-emitting device includes a pixel electrode, an intermediate layer including an organic light-emitting layer, and an opposite electrode. In addition, a circuit unit for driving the organic light-emitting device also has a configuration including a plurality of wiring layers that are stacked, and insulating layers for preventing short circuit between the plurality of wiring layers may be placed between the plurality of wiring layers. The insulating layers may include inorganic or organic matter.

SUMMARY

In an insulating layer including the organic matter, gas generated from the organic matter may not be entirely discharged during a manufacturing process of a display device and may partially remain in the insulating layer, outgassing may occur from the insulating layer including the organic matter during use of the display device. In addition, when the display device is used outdoors for a long time, the insulating layer including the organic matter may start decomposing due to sunlight, and gas may be generated in the decomposition process. As described above, when gas is generated from the insulating layer including the organic matter, the organic light-emitting layer is deteriorated by the generated gas and defects such as pixel shrinkage are generated, and thus, reliability of the display device is declined. One or more embodiments include a display device capable of minimizing outgassing from an insulating layer including organic matter, and a manufacturing method thereof.

Additional aspects will be set forth in part in the description which follows and, in part, will be apparent from the description, or may be learned by practice of the presented embodiments of the disclosure.

According to one or more embodiments, a display device includes a substrate including a display area and a peripheral area; a thin film transistor arranged on the substrate; a first metal wiring layer electrically connected to the thin film transistor; an inorganic protective layer on the first metal wiring layer; a patterned first organic film layer located on the inorganic protective layer and overlapping the first metal wiring layer in a plan view; a second metal wiring layer on the first organic film layer; and a second organic film layer on the second metal wiring layer, where the first organic film layer is patterned to be arranged at a position where the first metal wiring layer and the second metal wiring layer overlap each other in the plan view, and is not arranged on an entirety of the display area, and the second organic film layer is arranged on the entire display area.

In an embodiment, the first metal wiring layer may include a plurality of wires apart from each other and the second organic film layer may contact an upper surface of the inorganic protective layer between the plurality of wires.

In an embodiment, the second organic film layer may have a concave shape at a position in contact with the upper surface of the inorganic protective layer.

In an embodiment, the display device may further include a light-emitting device electrically connected to the thin film transistor, where the light-emitting device may include a pixel electrode, a common electrode, and an intermediate layer having a light-emitting layer between the pixel electrode and the common electrode, and the pixel electrode is located on the second organic film layer and the first organic film layer may be arranged at a position to overlap the pixel electrode.

In an embodiment, the display device may further include an encapsulation layer located on the common electrode and including a first inorganic encapsulation layer, an organic encapsulation layer, and a second inorganic encapsulation layer that are sequentially stacked.

In an embodiment, the thin film transistor may include a semiconductor layer and a gate electrode, the first metal wiring layer may include a scan line electrically connected to the gate electrode, and the scan line may be in a different layer from a layer the gate electrode is located in.

In an embodiment, the display device may further include a first insulating layer between the semiconductor layer and the gate electrode, and a second insulating layer and an interlayer insulating layer on the gate electrode, where the scan line may be on the interlayer insulating layer.

In an embodiment, the display device may further include an upper electrode having a storage capacitance and being arranged between the second insulating layer and the interlayer insulating layer at a position to overlap the gate electrode in the plan view.

In an embodiment, the second metal wiring layer may include a wire located directly on the inorganic protective layer exposed by the patterned first organic film layer.

In an embodiment, the second metal wiring layer may include a data line and a driving voltage line.

According to one or more embodiments, a display device includes a substrate, a thin film transistor on the substrate, a first metal wiring layer electrically connected to the thin film transistor, a first organic film layer arranged to overlap the first metal wiring layer in a plan view, a second metal wiring layer on the first organic film layer, and a second organic film layer on the second metal wiring layer, where the first metal wiring layer includes a plurality of wires apart from each other, and the second organic film layer has a concave shape between the plurality of wires.

In an embodiment, the first metal wiring layer may include a scan line, and the first organic film layer may be disposed to extend along the scan line.

In an embodiment, the thin film transistor may include a semiconductor layer and a gate electrode, the scan line may be electrically connected to the gate electrode, and the scan line and the gate electrode may be arranged in different layers from each other.

In an embodiment, the display device may further include a first insulating layer between the semiconductor layer and the gate electrode, and a second insulating layer and an interlayer insulating layer on the gate electrode, where the scan line may be on the interlayer insulating layer.

In an embodiment, the display device may further include an upper electrode having a storage capacitance and being arranged between the second insulating layer and the interlayer insulating layer at a position to overlap the gate electrode in the plan view.

In an embodiment, the display device may further include an inorganic protective layer on the first metal wiring layer, where the first organic film layer may be located on the inorganic protective layer, and the second organic film layer may contact an upper surface of the inorganic protective layer according to the concave shape.

In an embodiment, the second metal wiring layer may include a wire located directly on the inorganic protective layer exposed by the patterned first organic film layer.

In an embodiment, the display device may further include a light-emitting device electrically connected to the thin film transistor, where the light-emitting device may include a pixel electrode, a common electrode, and an intermediate layer having a light-emitting layer between the pixel electrode and the common electrode, and the pixel electrode may be located on the second organic film layer and the first organic film layer may be arranged at a position to overlap the pixel electrode.

In an embodiment, the display device may further include an encapsulation layer located on the common electrode and including a first inorganic encapsulation layer, an organic encapsulation layer, and a second inorganic encapsulation layer that are sequentially stacked.

In an embodiment, the second metal wiring layer may include a data line and a driving voltage line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
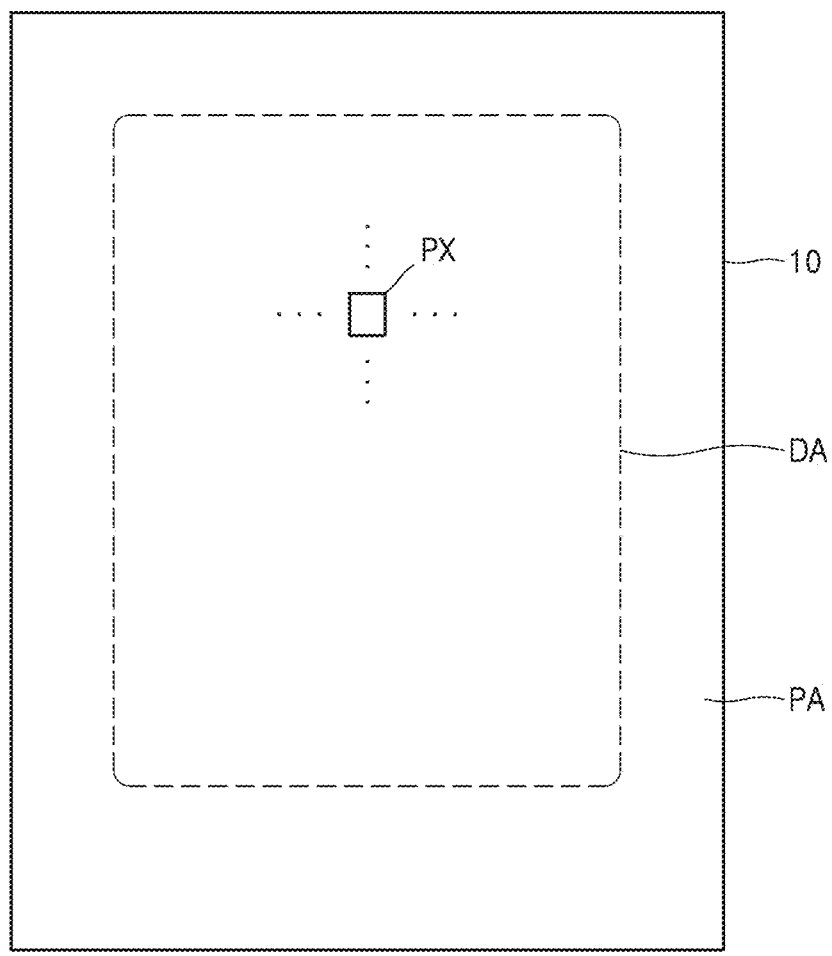
FIG. 1 is a plan view of a display device according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of components in the drawings are arbitrarily illustrated for convenience of explanation, the following embodiments according to the invention are not limited thereto.

When a certain embodiment may be implemented differently, a specific process order may be performed differently from the described order. For example, two consecutively described processes may be performed substantially at the same time or performed in an order opposite to the described order.

Hereinafter, embodiments will be described in detail with reference to the accompanying drawings. The same reference numerals are used to denote the same elements.

FIG. 1 is a plan view of a display device according to an embodiment.

Referring to FIG. 1, a display device 10 may include a display area DA and a peripheral area PA located outside the display area DA. The display device 10 may provide an image through an array of a plurality of pixels PX arranged two-dimensionally in the display area DA. The peripheral area PA is an area that does not provide an image, and may entirely or partially surround the display area DA. A driver for providing an electrical signal or power to the pixels PX may be arranged in a peripheral area PA. In the peripheral area PA, a pad area that is an area to which an electronic device or a printed circuit board may be electrically connected may be arranged.

Hereinafter, although the display device 10 is described as including an organic light-emitting diode OLED as a display element, the display device 10 of the disclosure according to the invention is not limited thereto. As another embodiment, the display device 10 may be a light-emitting display device (an inorganic light-emitting display or an inorganic electroluminescence ("EL") display device) including inorganic matter such as a micro light-emitting diode ("LED"), or a display device such as a quantum dot light-emitting display. For example, a light-emitting layer of a display element provided in the display device 10 may include organic matter, inorganic matter, a quantum dot, organic matter and a quantum dot, or inorganic matter and a quantum dot.

Figure 2:
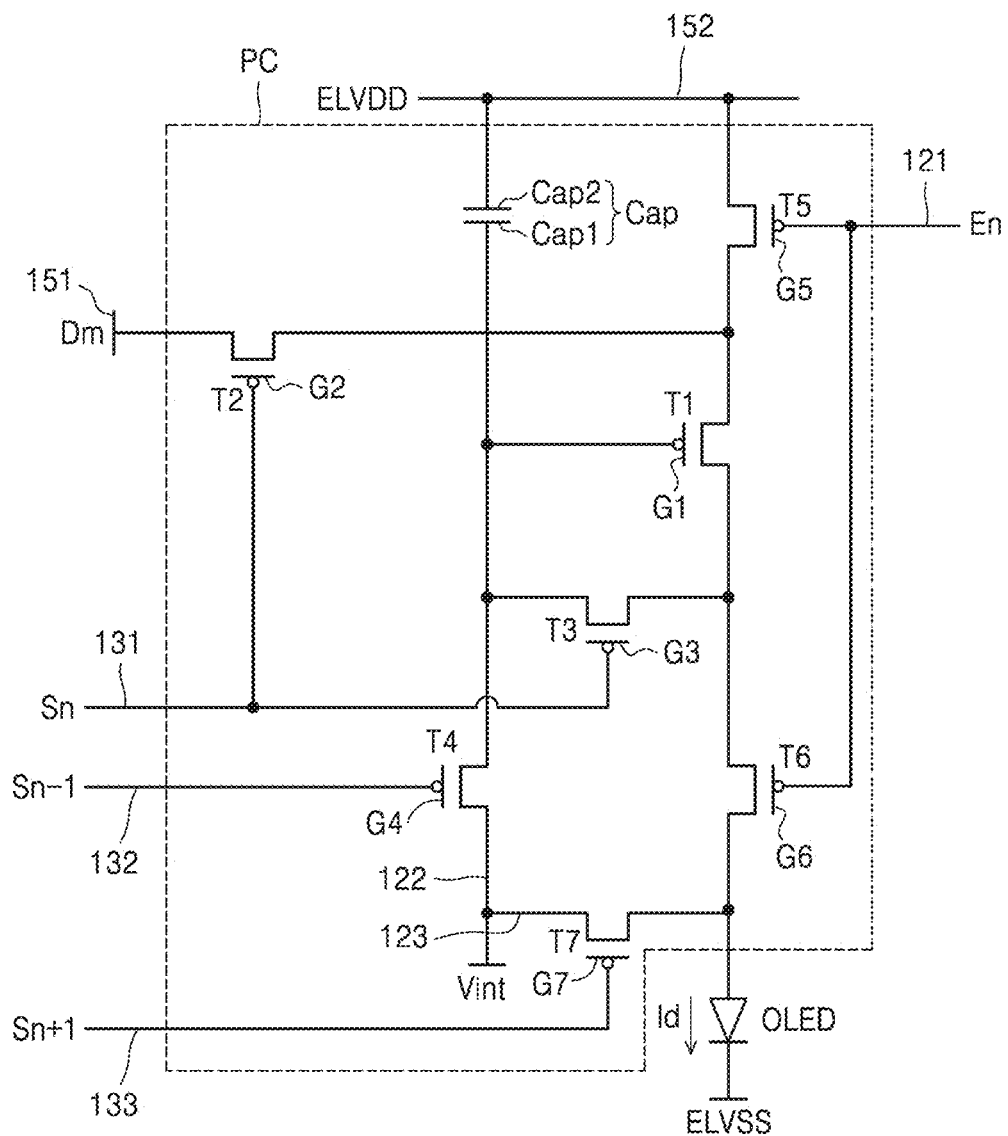
FIG. 2 is an equivalent circuit diagram of a pixel circuit included in a display device according to an embodiment.

FIG. 2 is an equivalent circuit diagram of a pixel circuit included in a display device according to an embodiment.

Referring to FIG. 2, the display device 10 includes signal lines 121, 131, 132, 133, and 151, a plurality of thin film transistors T1 to T7 connected to the signal lines, a storage capacitor Cap, and a pixel circuit PC including first and second initialization voltage lines 122 and 123 and a driving voltage line 152. Also, the display device 10 may include an organic light-emitting diode OLED that emits light by receiving a driving voltage through the pixel circuit PC as a light-emitting device.

FIG. 2 illustrates a case where the signal lines 121, 131, 132, 133, and 151, the first and second initialization voltage lines 122, 123, and the driving voltage lines 152 are provided for each pixel circuit PC. However, the disclosure according to the invention is not limited thereto. As another embodiment, at least one of the signal lines 121, 131, 132, 133, and 151, and/or the first and second initialization voltage lines 122 and 123 may be shared by neighboring pixel circuits PC.

The pixel circuit PC may include a plurality of thin film transistors and a storage capacitor. According to an embodiment, as shown in FIG. 2, the thin film transistors may include a driving thin-film transistor T1, a switching thin-film transistor T2, a compensation thin-film transistor T3, a first initialization thin-film transistor T4, a motion control thin-film transistor T5, a light emission control thin-film transistor T6, and a second initialization thin-film transistor T7.

The signal lines includes the scan line 131 transmitting a scan signal Sn, the previous scan line 132 transmitting a previous scan signal Sn−1 to the first initialization thin film transistor T4, the subsequent scan line 133 transmitting a subsequent scan signal Sn+1 to the second initialization thin film transistor T7, the light emission control line 121 transmitting a light emission control signal En to the motion control thin film transistor T5 and the light emission control thin film transistor T6, and the data line 151 crossing the scan line 131 and transmitting a data signal Dm. The driving voltage line 152 may transmit a driving voltage ELVDD to the driving thin film transistor T1, and the first and second initialization voltage lines 122 and 123 may transmit an initialization voltage Vint that initializes the driving thin film transistor T1 and a pixel electrode.

A driving gate electrode G1 of the driving thin film transistor T1 is connected to an electrode (e.g., a lower electrode Cap1) of a storage capacitor Cap, one of a source electrode and a drain electrode of the driving thin film transistor T1 is connected to the driving voltage line 152 via the motion control thin film transistor T5, and the other of the source electrode and the drain electrode of the driving thin film transistor T1 is electrically connected to a pixel electrode of the organic light-emitting diode OLED via the light emission control thin film transistor T6. The driving thin-film transistor T1 receives the data signal Dm according to a switching operation of the switching thin-film transistor T2 and supplies a driving current Id to the organic light-emitting diode OLED.

A switching gate electrode G2 of the switching thin film transistor T2 is connected to the scan line 131, one of the source electrode and the drain electrode of the switching thin film transistor T2 is connected to the data line 151, and the other of the source electrode and the drain electrode of the switching thin film transistor T2 is connected to the driving voltage line 152 via the motion control thin film transistor T5 while being connected to the driving thin film transistor T1. The switching thin-film transistor T2 is turned on in response to the scan signal Sn received through the scan line 131 and performs a switching operation for transmitting the data signal Dm transmitted to the data line DL to the driving thin-film transistor T1.

A compensation gate electrode G3 of the compensation thin-film transistor T3 is connected to the scan line 131, one of a source electrode and a drain electrode of the compensation thin film transistor T3 is connected to the pixel electrode of the organic light-emitting diode OLED via the light emission control thin film transistor T6 while being connected to the driving thin film transistor T1, and the other of the source electrode and the drain electrode of the compensation thin film transistor T3 is connected to an electrode (e.g., a lower electrode Cap1) of the storage capacitor Cap, the first initialization thin film transistor T4, and the driving thin film transistor T1. The compensation thin-film transistor T3 is turned on in response to the scan signal Sn received through the scan line 131 and electrically connects the driving gate electrode G1 of the driving thin film transistor T1 to one (e.g., the drain electrode) of the source electrode and the drain electrode of the driving thin film transistor T1 to diode-connect the driving thin film transistor T1.

A first initialization gate electrode G4 of the first initialization thin film transistor T4 is connected to the previous scan line 132, one of a source electrode and a drain electrode of the first initialization thin film transistor T4 is connected to a first initialization voltage line 122, and the other of the source electrode and the drain electrode of the first initialization thin film transistor T4 is connected to the electrode (e.g., a lower electrode Cap1) of the storage capacitor Cap, the compensation thin film transistor T3, and the driving thin film transistor T1. The first initialization TFT T4 is turned on in response to the previous scan signal Sn−1 received through the previous scan line 132 and initializes a voltage of the driving gate electrode G1 by transmitting the initialization voltage Vint to the driving gate electrode G1 of the driving thin film transistor T1.

A motion control gate electrode G5 of the motion control thin film transistor T5 is connected to a light emission control line EL, one of a source electrode and a drain electrode of the motion control thin film transistor T5 is connected to the driving voltage line 152, and the other of the source electrode and the drain electrode of the motion control thin film transistor T5 is connected to the driving thin film transistor T1 and the switching thin film transistor T2.

A light emission control gate electrode G6 of the light emission control thin film transistor T6 is connected to the light emission control line EL, one of a source electrode and a drain electrode of the light emission control thin film transistor T6 is connected to the driving thin film transistor T1 and a compensation source electrode S3 of the compensation thin film transistor T3, and the other of the source electrode and the drain electrode of the light emission control thin film transistor T6 is electrically connected to the second initialization thin film transistor T7 and the pixel electrode of the organic light-emitting diode OLED.

The motion control thin-film transistor T5 and the light emission control thin-film transistor T6 are simultaneously turned on in response to the light emission control signal En received through the light emission control line 121 so that the driving voltage ELVDD is transmitted to the organic light-emitting diode OLED and the driving current Id flows through the organic light-emitting diode OLED.

A second initialization gate electrode G7 of the second initialization thin film transistor T7 may be connected to the subsequent scan line 133 which is connected to another pixel PX arranged in a subsequent row of a current pixel PX. In addition, one of a source electrode and a drain electrode of the second initialization thin film transistor T7 is connected to the light emission control thin film transistor T6 and the pixel electrode of the organic light-emitting diode OLED, and the other of the source electrode and the drain electrode of the second initialization thin film transistor T7 is connected to a second initialization voltage line 123.

Because the scan line 131 and the subsequent scan line 133 are electrically connected to each other (not shown), the same scan signal Sn may be applied to the scan line 131 and the subsequent scan line 133. Accordingly, the second initialization thin film transistor T7 may be turned on according to the scan signal Sn received through the subsequent scan line 133 to initialize the pixel electrode of the organic light-emitting diode OLED.

As another example, the first initialization thin film transistor T4 and the second initialization thin film transistor T7 may be connected to the previous scan line 132 together.

The other electrode (e.g., an upper electrode Cap2) of the storage capacitor Cap is connected to the driving voltage line 152, and an opposite electrode of the organic light-emitting diode OLED is connected to a line supplying a common voltage ELVSS. Accordingly, the organic light-emitting diode OLED may emit light by receiving the driving current Id from the driving thin-film transistor T1 and therefore display an image.

FIG. 2 illustrates that the pixel circuit PC includes seven thin-film transistors and one storage capacitor Cap, but the disclosure according to the invention is not limited thereto. The number of thin-film transistors and the number of storage capacitors may be variously changed according to the design of the pixel circuit PC.

Figure 3:
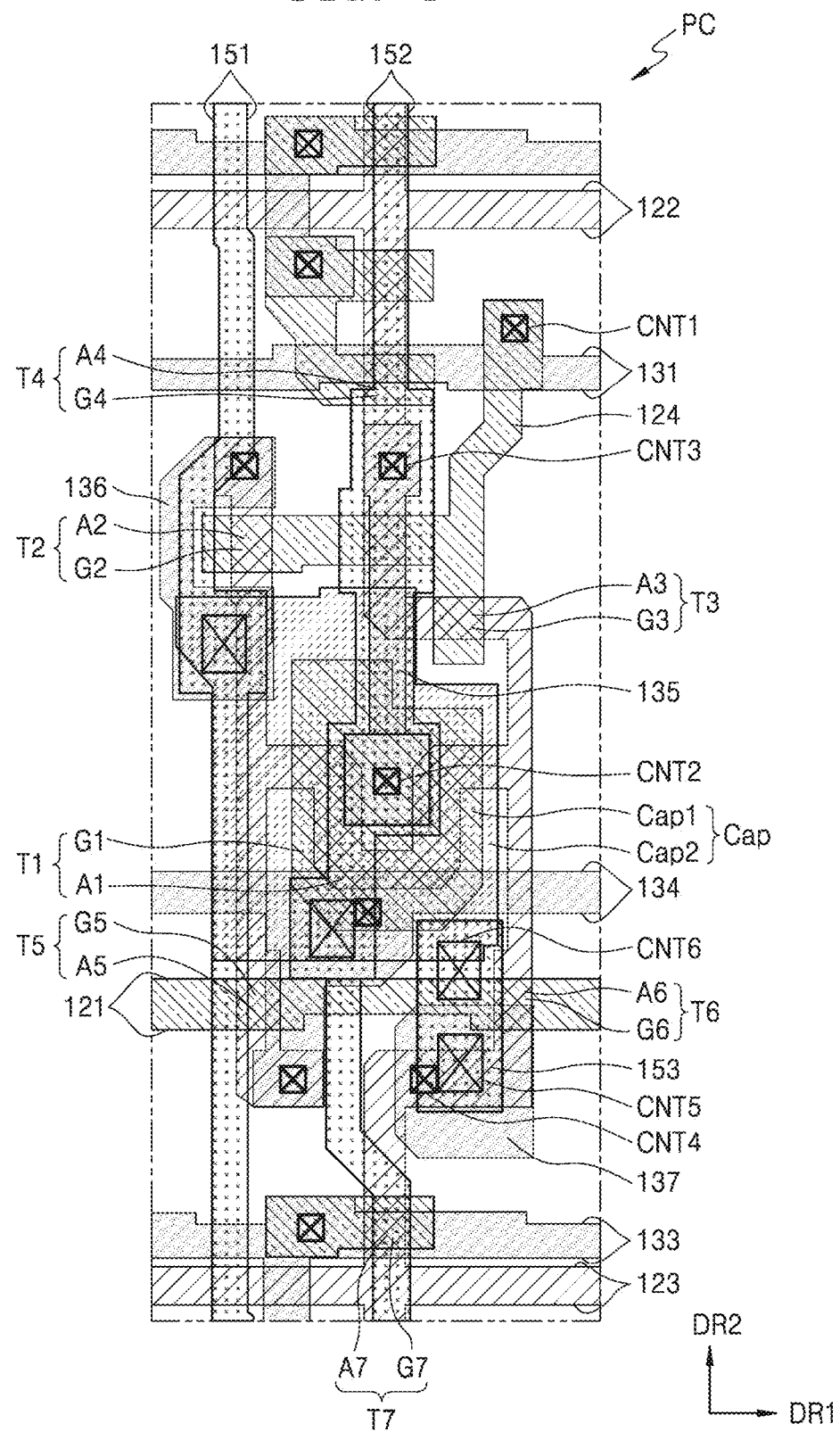
FIG. 3 is a layout view showing positions of a plurality of thin film transistors and a capacitor included in a pixel circuit according to an embodiment.
Figure 9:
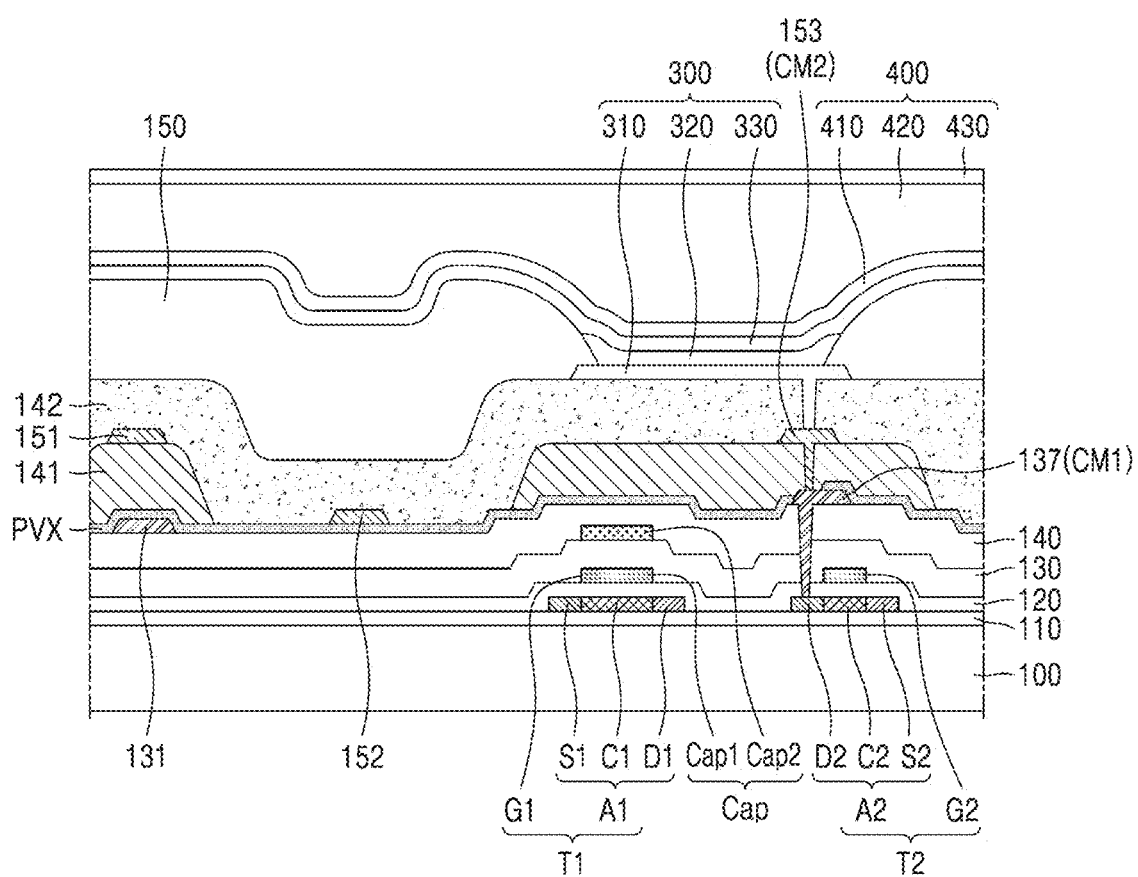
FIG. 9 is a cross-sectional view of a cross-section of a portion of the display device of FIG. 1.

FIG. 3 is a layout view showing positions of a plurality of thin film transistors and a capacitor included in a pixel circuit according to an embodiment, FIGS. 4 to 8 are layout views of configurations of the plurality of thin film transistors and the capacitor of FIG. 3 for each layer, and FIG. 9 is a cross-sectional view of a cross-section of a portion of the display device of FIG. 1.

Hereinafter, a structure of the pixel circuit PC (of FIG. 3) will be described in more detail with reference to FIGS. 3 to 9 together. FIG. 9 is for explaining the structure of the display device 10 (of FIG. 1), and does not show a cross-section at a specific position of the display device 10 (of FIG. 1). For example, in FIG. 9, a pixel electrode 310 and the switching thin film transistor T2 are illustrated as not directly connected to each other in a vertical direction, but are electrically connected to each other through a first metal wiring layer CM1 and a second metal wiring layer CM2, while the pixel electrode 310 and the switching thin film transistor T2 may not overlap in the vertical direction in the layout views (FIGS. 3 to 8).

The arrangement diagram as shown in FIG. 3 is a layout diagram of one pixel circuit, and pixel circuits having the same/similar configuration may be arranged up, down, left, and right of the one pixel circuit. Each of FIGS. 4 to 8 shows an arrangement of wires or semiconductor layers in the same layer, and an insulating layer or the like may be disposed between layered structures shown in FIGS. 4 to 8.

Referring to FIGS. 3 to 9, the display device may include the driving thin-film transistor T1, the switching thin-film transistor T2, the compensation thin-film transistor T3, the first initialization thin-film transistor T4, the motion control thin-film transistor T5, the light emission control thin-film transistor T6, the second initialization thin-film transistor T7, the storage capacitor Cap, and an organic light-emitting device (not shown).

A driving semiconductor layer A1 of the driving thin film transistor T1, a switching semiconductor layer A2 of the switching thin film transistor T2, a compensation semiconductor layer A3 of the compensation thin film transistor T3, a first initialization semiconductor layer A4 of the first initialization thin film transistor T4, a motion control semiconductor layer A5 of the motion control thin-film transistor T5, a light emission control semiconductor layer A6 of the light emission control thin film transistor T6, and a second initialization semiconductor layer A7 of the second initialization thin film transistor T7 are arranged on a substrate 100 and may include the same material.

The substrate 100 may include glass or a polymer resin. The polymer resin may include polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including a layer including the above-described polymer resin and an inorganic layer (not shown).

A buffer layer 110 may further be located on the substrate 100. The buffer layer 110 may include an inorganic insulating material. For example, the buffer layer 110 may be a single layer or multiple layers including at least one of silicon oxynitride (SiON), silicon oxide (SiOx), and silicon nitride (SiNx).

The semiconductor layers A1 to A7 may include polycrystalline silicon or amorphous silicon. Alternatively, the semiconductor layers A1 to A7 may include an oxide semiconductor material including an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Further, the semiconductor layers A1 to A7 are connected to each other and may be bent in various shapes.

Each of the semiconductor layers A1 to A7 may include a channel area, and a source area and a drain area on both sides of the channel area, respectively. For example, the source area and the drain area may be doped with impurities, and the impurities may include N-type impurities or P-type impurities. The source area and the drain area may correspond to a source electrode and a drain electrode of a thin film transistor, respectively. Hereinafter, for convenience, the terms, source area and drain area are used instead of the source electrode and the drain electrode.

A first insulating layer 120 is located on the semiconductor layers A1 to A7. The first insulating layer 120 may be a single layer or multiple layers including at least one of SiON, SiOx, and SiNx.

Figure 5:
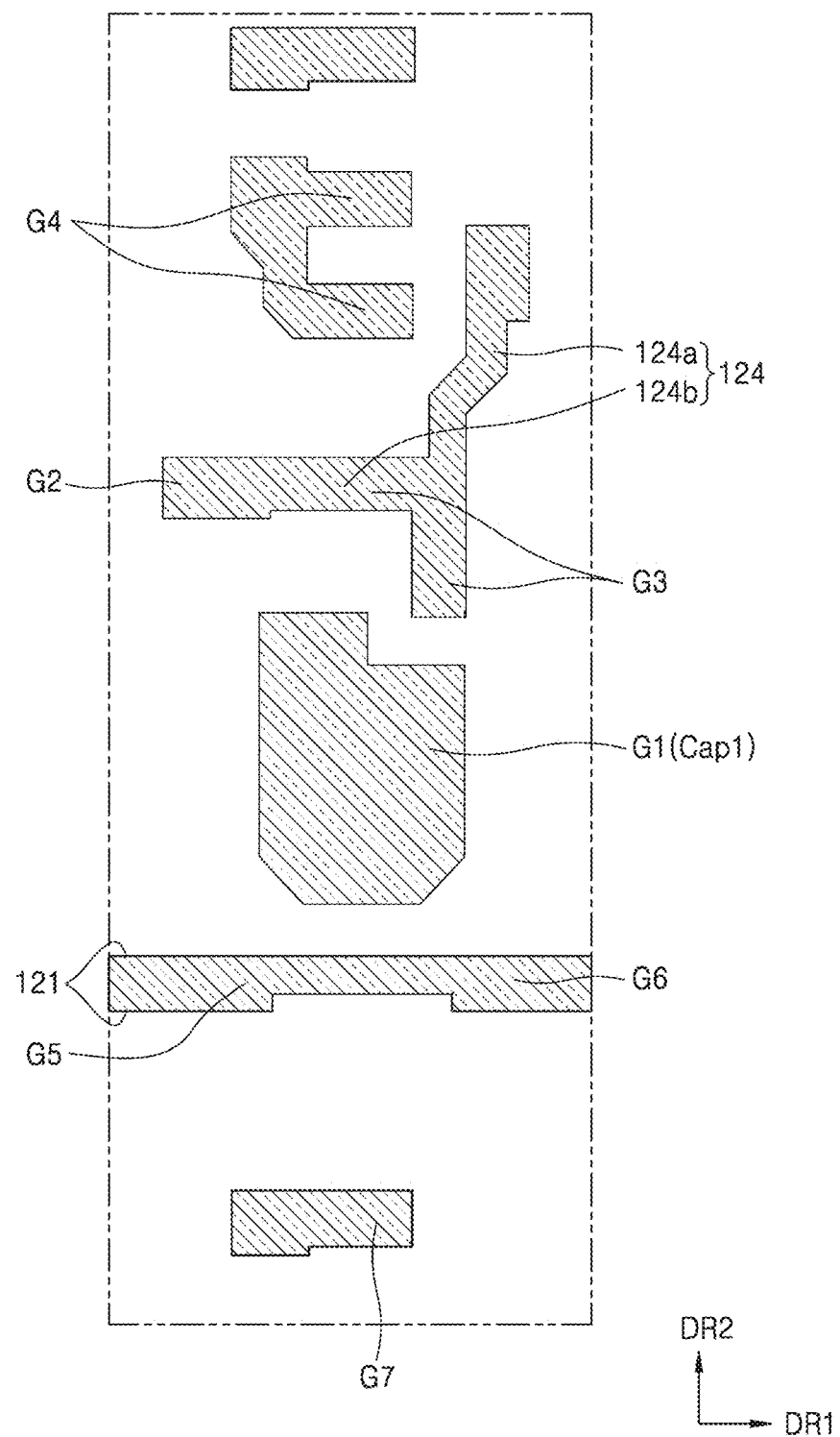

On the first insulating layer 120, as shown in FIG. 5, the driving gate electrode G1 of the driving thin film transistor T1, the switching gate electrode G2 of the switching thin film transistor T2, the compensation gate electrode G3 of the compensation thin film transistor T3, the first initialization gate electrode G4 of the first initialization thin film transistor T4, the motion control gate electrode G5 of the motion control thin-film transistor T5, the light emission control gate electrode G6 of the light emission control thin film transistor T6, and the second initialization gate electrode G7 of the second initialization thin film transistor T7 may be arranged. The gate electrodes G1 to G7 include molybdenum (Mo), titanium (Ti), and the like and may be formed as a single layer or multiple layers.

The gate electrodes G1 to G7 may be located to overlap the semiconductor layers A1 to A7, respectively. As an example, as shown in FIG. 9, the driving thin film transistor T1 includes the driving semiconductor layer A1 and the driving gate electrode G1 at a position to overlap the driving semiconductor layer A1, and the switching thin film transistor T2 includes the switching semiconductor layer A1 and the switching gate electrode G2 at a position to overlap the switching semiconductor layer A2. In this case, the driving semiconductor layer A1 may include a driving channel area C1 overlapping the driving gate electrode G1, and a driving source area S1 and a driving drain area D1 on both sides of the driving channel area C1, respectively, and the switching semiconductor layer A2 may include a switching channel area C2 overlapping the switching gate electrode G2, and a switching source area S2 and a switching drain area D2 on both sides of the switching channel area C2, respectively. This structure may also be the same in the compensation thin-film transistor T3, the first initialization thin-film transistor T4, the motion control thin-film transistor T5, the light emission control thin-film transistor T6, and the second initialization thin-film transistor T7.

Figure 4:
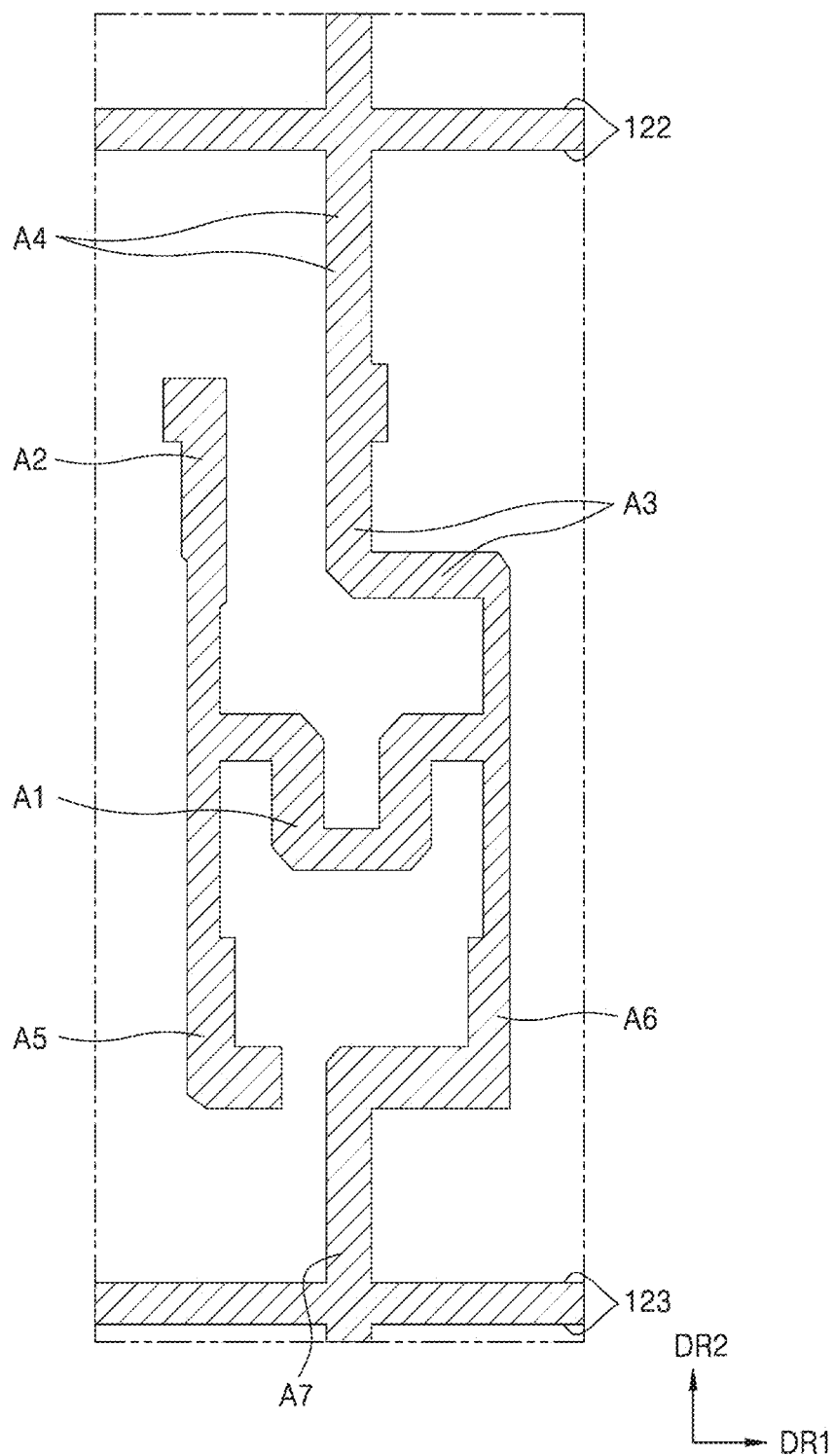
FIGS. 4 to 8 are layout views of configurations of the plurality of thin film transistors and the capacitor of FIG. 3 for each layer.

As shown in FIG. 4, the driving semiconductor layer A1 may be formed by being curved, and the storage capacitor Cap may be disposed on the driving thin film transistor T1 to overlap the driving thin film transistor T1. The driving semiconductor layer A1 has a curved shape and may be longer than each of the other semiconductor layers A2 to A7. For example, the driving semiconductor layer A1 may have a shape bent a plurality of times such as an omega shape or the letter "S" to form a long channel length in a narrow space. Because the driving semiconductor layer A1 is longer, a driving range of a gate voltage applied to the driving gate electrode G1 is widened, such that the gradation of light emitted from the organic light-emitting diode OLED may be more precisely controlled and display quality may be improved.

One end of the driving semiconductor layer A1 of the driving thin film transistor T1 is connected to the switching semiconductor layer A2 and the motion control semiconductor layer A5, and the other end of the driving semiconductor layer A1 may be connected to the compensation semiconductor layer A3 and the light emission control semiconductor layer A6.

Figure 6:
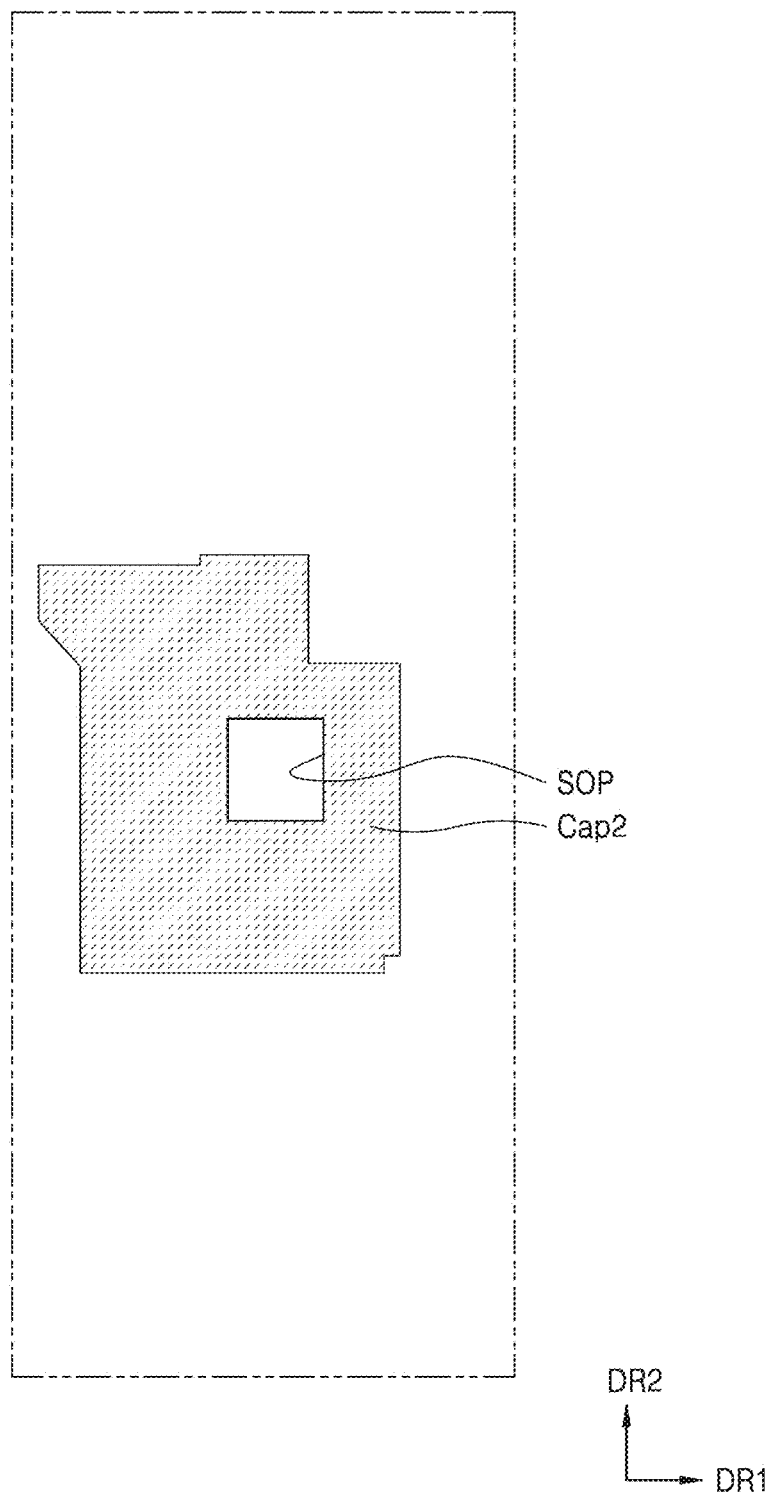

The second insulating layer 130 is located on the gate electrodes G1 to G7, and as shown in FIGS. 5, 6 and 9, the storage capacitor Cap may include a lower electrode Cap1 and an upper electrode Cap2 with a second insulating layer 130 therebetween. Here, the driving gate electrode G1 may also function as the lower electrode Cap1. That is, the driving gate electrode G1 may be formed integrally with the lower electrode Cap1. A second insulating layer 130 (of FIG. 9) functions as a dielectric of the storage capacitor Cap, and a storage capacitance may be determined by an electric charge stored in the storage capacitor Cap and a voltage between the electrodes Cap1 and Cap2.

The lower electrode Cap1 may be an island-shaped electrode and may include the same material as the material of the switching gate electrode G2, the compensation gate electrode G3, the first initialization gate electrode G4, the motion control gate electrode G5, the light emission control gate electrode G6, or the second initialization gate electrode G7. The lower electrode Cap1 may be disposed in the same layer as the switching gate electrode G2, the compensation gate electrode G3, the first initialization gate electrode G4, the motion control gate electrode G5, the light emission control gate electrode G6, or the second initialization gate electrode G7.

The upper electrode Cap2 may be on the second insulating layer 130. The upper electrode Cap2 is arranged to overlap the entire lower electrode Cap1 in a plan view, and may define a storage opening SOP (See FIG. 6). The storage opening SOP is provided to overlap the lower electrode Cap1. The storage opening SOP may have a shape of a single closed curve penetrating the upper electrode Cap2. The single closed curve means a closed figure having the same start point and end point when a point is drawn on a straight line or a curve such as a polygon or a circle. The upper electrode Cap2 is connected to the driving voltage line 152 through a contact hole to receive the driving voltage ELVDD (FIG. 2).

An interlayer insulating layer 140 is on the upper electrode Cap2. The interlayer insulating layer 140 may be a single layer or multiple layers including at least one of SiON, SiOx, and SiNx.

Figure 7:
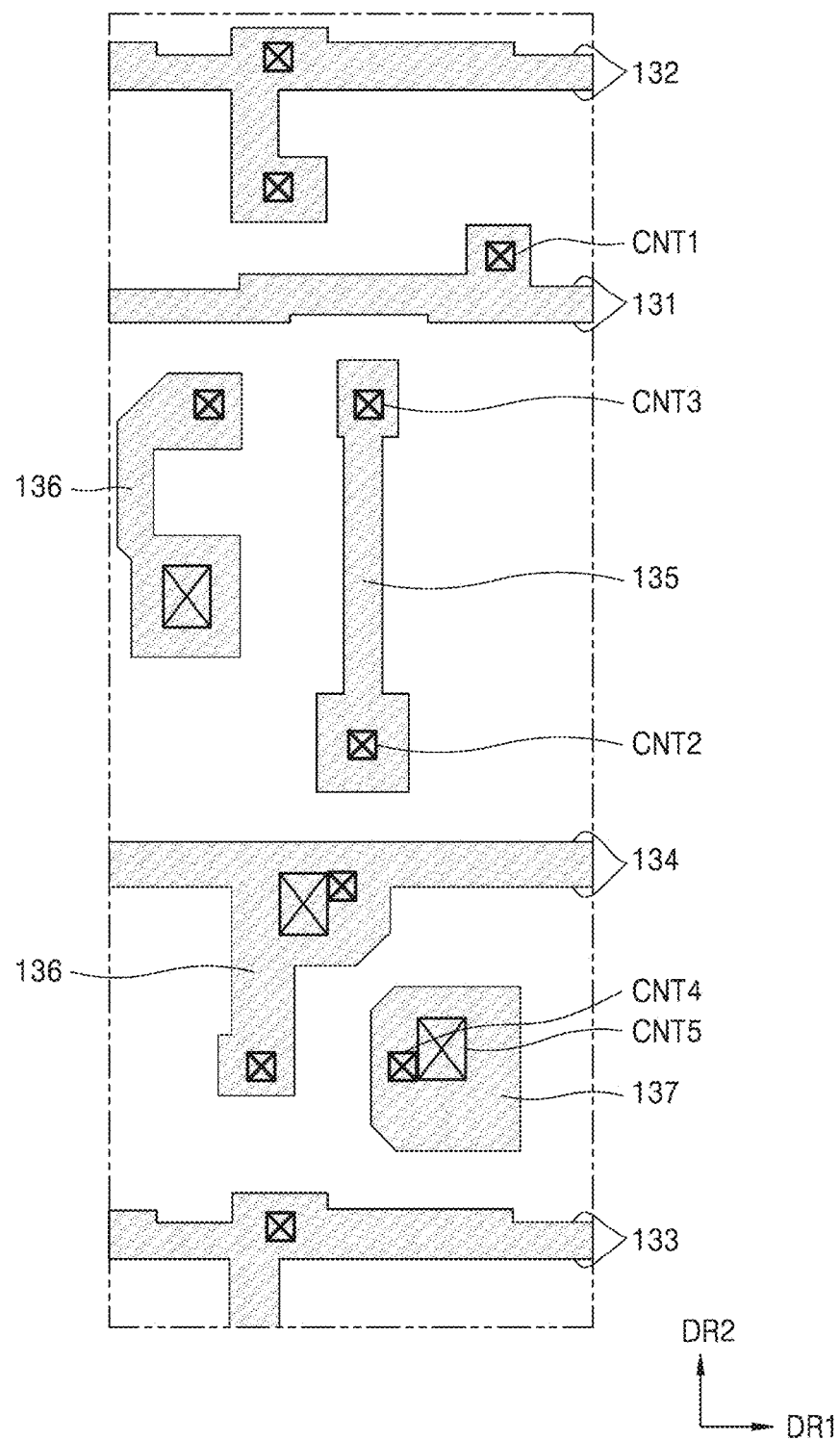
Figure 8:
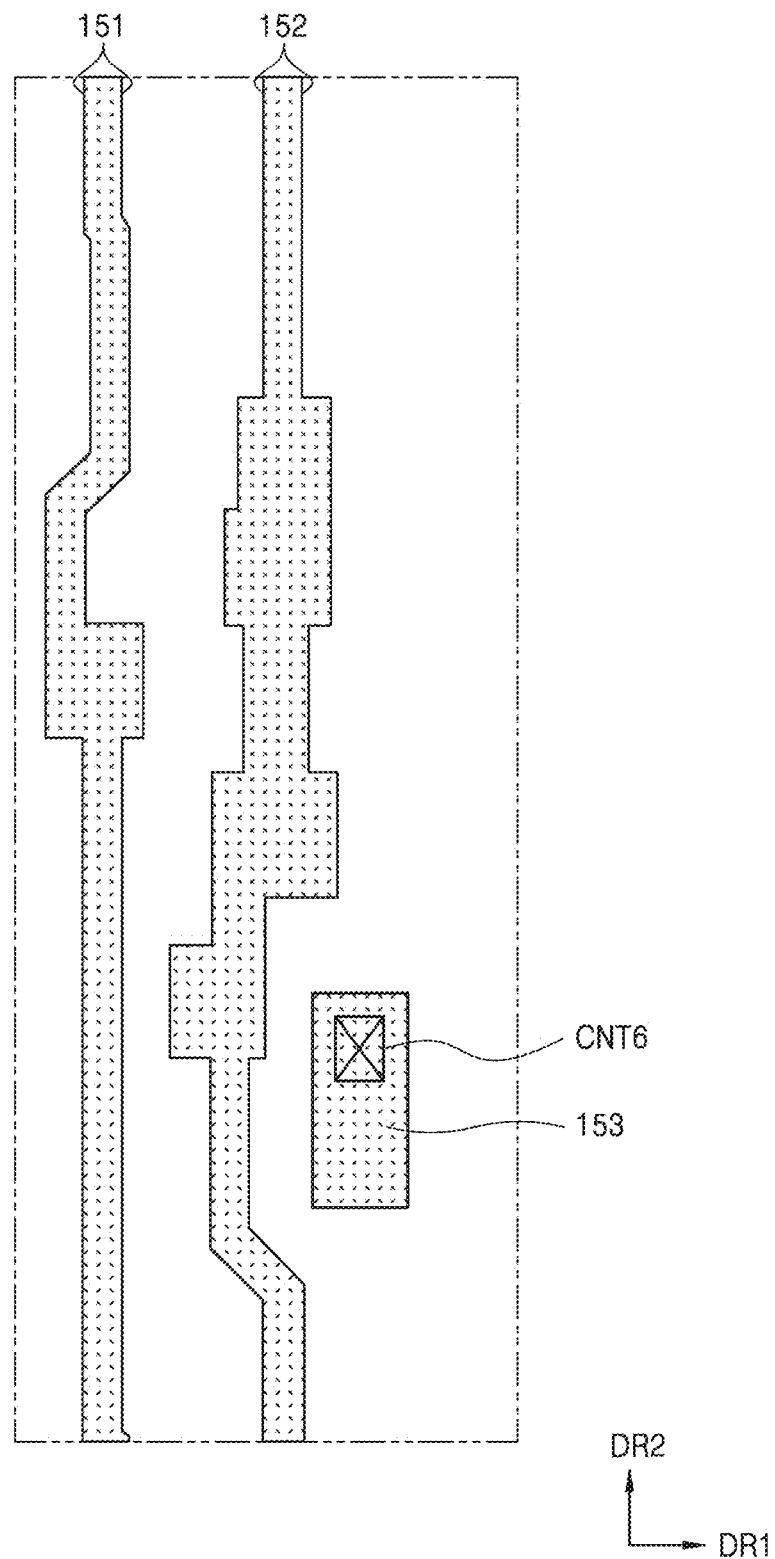

On the interlayer insulating layer 140, as shown in FIGS. 7 and 9, the scan line 131, the previous scan line 132, the subsequent scan line 133, a horizontal driving voltage line 134, a node connection line 135, a connection electrode 136, and an intermediate connection layer 137 may be located. As described above, wires apart from each other on the interlayer insulating layer 140 are referred to as the first metal wiring layer CM1. For example, the first metal wiring layer CM1 may include the scan line 131, the previous scan line 132, and the intermediate connection layer 137.

Each of the scan line 131, the previous scan line 132, and the subsequent scan line 133 are arranged on different layers from the gate electrodes G1 to G7 of the thin film transistors T1 to T7, and may have resistance less than each resistance of the gate electrodes G1 to G7. That is, a resistivity value of the scan line 131 may be less than each resistivity value of the gate electrodes G1 to G7. Through this, an RC delay phenomenon caused by application of a scan signal may be prevented or minimized.

For example, the scan line 131, the previous scan line 132, and the subsequent scan line 133 may include a conductive material including Al, copper (Cu), Ti, Mo, or the like, and may be a single layer or multiple layers. For example, the scan line 131, the previous scan line 132, and the subsequent scan line 133 may be formed of or include a multilayer structure of Ti/Al/Ti.

The scan line 131 may be electrically connected to a gate connection line 124 through a first contact hole CNT1 (See FIG. 3). Similarly, because the previous scan line 132 and the subsequent scan line 133 are arranged on a different layer from that of the gate electrodes G1 to G7 connected to them, the scan line 131, the previous scan line 132, and the subsequent scan line 133 may be connected to the gate electrodes G1 to G7 through contact holes.

The horizontal driving voltage line 134 may extend in a first direction DR1. The horizontal driving voltage line 134 may be connected to the driving voltage line 152 extending in a second direction DR2 through a contact hole. Accordingly, the horizontal driving voltage line 134 and the driving voltage line 152 may form a mesh structure. The horizontal driving voltage line 134 may be connected to the one of the source and drain electrodes of the motion control thin film transistor T5 and the storage capacitor Cap through a contact hole, and thus the motion control thin film transistor T5 and the upper electrode Cap2 may receive the driving voltage ELVDD (of FIG. 2) from the driving voltage line 152 and the horizontal driving voltage line 134.

One end of the node connection line 135 is connected to the lower electrode Cap1 through a second contact hole CNT2. The other end of the node connection line 135 may be connected together with the compensation semiconductor layer A3 and the first initialization semiconductor layer A4 through a third contact hole CNT3.

The connection electrode 136 may connect the switching semiconductor layer A2 to the data line 151. One end of the connection electrode 136 may be connected to the switching semiconductor layer A2 through a contact hole, and the other end may be connected to the data line 151 through a contact hole. The connection electrode 136 may be disposed to bypass an area where the switching gate electrode G2 is arranged so as not to overlap the switching gate electrode G2 on a plane.

The intermediate connection layer 137 may be connected to the light emission control semiconductor layer A6 and an auxiliary connection layer 153 (of FIG. 8) through a fourth contact hole CNT4. The intermediate connection layer 137 may be electrically connected to the pixel electrode 310 of the organic light-emitting device through the auxiliary connection layer 153 as described later below.

An inorganic protective layer PVX may be disposed on the first metal wiring layer CM1. The inorganic protective layer PVX may be a single layer or multiple layers of SiNx and SiOx. The inorganic protective layer PVX, during a manufacturing process of the display device 10 (of FIG. 1), may prevent the first metal wiring layer CM1 from being damaged in a patterning process of the pixel electrode 310 by preventing the first metal wiring layer CM1 from being exposed to an etchant used when patterning the pixel electrode 310.

A first organic film layer 141 may be on the inorganic protective layer PVX. The first organic film layer 141 may include a general polymer such as benzocyclobutene ("BOB"), polyimide ("PI"), hexamethyldisiloxane ("HMDSO"), polymethylmethacrylate ("PMMA"), and polystyrene ("PS"), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

The first organic film layer 141 is not formed over the entire display area DA (of FIG. 1), and is patterned and formed on only some parts of the substrate 100 as illustrated in FIG. 9. As such, when the first organic film layer 141 is partially formed on the substrate 100, the volume of the first organic film layer 141 is reduced compared to when the first organic film layer 141 is formed on the entire display area DA (of FIG. 1). Accordingly, outgassing of organic matter is reduced, and defects such as pixel shrinkage due to outgassing may be prevented and/or reduced. In addition, even when the display device 10 (of FIG. 1) is exposed to sunlight for a long time, the amount of organic matter that may decompose due to sunlight may be reduced, and thus, the reliability of the display device 10 (of FIG. 1) may be improved.

The data line 151, the driving voltage line 152, and the auxiliary connection layer 153 may be on the first organic film layer 141 or the inorganic protective layer PVX exposed between areas in the patterned first organic film layer 141. As such, wires on the first organic film layer 141 or the inorganic protective layer PVX exposed between areas in the patterned first organic film layer 141 are referred to as the second metal wiring layer CM2. For example, the second metal wiring layer CM2 may include the data line 151, the driving voltage line 152, and the auxiliary connection layer 153 (See FIG. 3).

When the first metal wiring layer CM1 and the second metal wiring layer CM2 are overlapped, the first organic film layer 141 covers the first metal wiring layer CM1 overlapping the second metal wiring layer CM2. As an example, the data line 151 and the driving voltage line 152 may be disposed on the scan line 131 with the first organic film layer 141 therebetween, and may extend in the second direction DR2 crossing the first direction DR1. In this case, the first organic film layer 141 may be patterned and disposed at least in an area where the data line 151 and the scan line 131 overlap and an area where the driving voltage line 152 and the scan line 131 overlap. Accordingly, a distance between the first metal wiring layer CM1 and the second metal wiring layer CM2 may be extended to minimize occurrence of a parasitic capacitance. That is, the first organic film layer 141, according to the types of wires included in the first metal wiring layer CM1 shown in FIG. 7, may be disposed to cover the wires. As another example, in order to control the volume of the first organic film layer 141, the first organic film layer 141 may be located to overlap some of the wires included in the first metal wiring layer CM1. As an example, the first organic film layer 141 may be disposed to extend to overlap scan lines such as the scan line 131, the previous scan line 132, and the subsequent scan line 133, and the horizontal driving voltage line 134.

The auxiliary connection layer 153 may be connected to the intermediate connection layer 137 through a fifth contact hole CNT5 defined in the first organic film layer 141.

A second organic film layer 142 is disposed on the second metal wiring layer CM2, and the pixel electrode 310 may be on the second organic film layer 142. The second organic film layer 142 may include a general polymer such as BCB, PI, HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

Unlike the first organic film layer 141, the second organic film layer 142 is disposed over the entire display area DA (of FIG. 1). In an area defined by the patterned first organic film layer 141 where the inorganic protective layer PVX is exposed, the second organic film layer 142 directly contacts the inorganic protective layer PVX. That is, the second organic film layer 142 is in contact with an upper surface of the inorganic protective layer PVX between the wires included in the first metal wiring layer CM1, and may have a concave shape (in a top plan view) at a portion in contact with the upper surface of the inorganic protective layer PVX. In other words, in a position where the first organic film layer 141 is not disposed, the second organic film layer 142 may have a curved shape. Therefore, in order to allow the pixel electrode 310 to be disposed on a flat position, the first organic film layer 141 may be disposed at a position to overlap the pixel electrode 310 in a plan view. That is, the first metal wiring layer CM1 may not be arranged under the first organic film layer 141 overlapping the pixel electrode 310.

A pixel-defining layer 150 may be disposed on the second organic film layer 142 to define an opening to expose the center of the pixel electrode 310 while an edge of the pixel electrode 310 is covered by the second organic film layer 142. The pixel-defining layer 150 may include an organic insulating material such as PI, polyamide, acrylic resin, BCB, HMDSO, and phenolic resin, and may be formed by spin coating.

An intermediate layer 320 including an emission layer is located in an opening in the pixel-defining layer 150. The intermediate layer 320 may include a low-molecular weight material or a polymer material. When the intermediate layer 320 includes a low-molecular weight material, the intermediate layer 320 may have a single or composite structure by stacking a hole injection layer ("HIL"), a hole transport layer ("HTL"), an emission layer ("EML"), an electron transport layer ("ETL"), and an electron injection layer ("EIL"). The intermediate layer 320 may include various organic matter, such as copper phthalocyanine ("CuPc"), N,N'-Di(naphthalene-1-yl)-N,N'-diphenyl-benzidine ("NPB"), and tris-8-hydroxyquinoline aluminum ("Alq3"). Such layers in the intermediate layer 320 may be formed by an evaporation method.

When the intermediate layer 320 includes a polymer material, the intermediate layer 320 may have a structure including an HTL and an EML. The HTL may include poly(ethylenedioxythiophene), and the EML may include a polymer material such as poly-phenylenevinylene ("PPV") and polyfluorene. However, the intermediate layer 320 according to the invention is not limited thereto, and may have various structures in another embodiment. For example, at least one of the layers constituting the intermediate layer 320 may be integrally formed over the plurality of pixel electrodes 310. Alternatively, the intermediate layer 320 may include a layer patterned to correspond to each of the plurality of pixel electrodes 310.

Also, a common electrode 330 may be arranged on the display area DA (of FIG. 1) and may be arranged to cover the display area DA (of FIG. 1). That is, the common electrode 330 may be integrally formed over the plurality of light-emitting devices 300.

An encapsulation layer 400 protecting a light-emitting device 300 from external moisture or oxygen may be on the common electrode 330. The encapsulation layer 400 has a shape extending to not only the display area DA (of FIG. 1) where the light-emitting device 300 is located, but also the peripheral area PA (of FIG. 1) outside the display area DA (of FIG. 1). The encapsulation layer 400 may have a multilayer structure. For example, as illustrated in FIG. 9, the encapsulation layer 400 may include a first inorganic encapsulation layer 410, an organic encapsulation layer 420, and a second inorganic encapsulation layer 430 that are sequentially stacked.

The first inorganic encapsulation layer 410 covers the common electrode 330 and may include silicon oxide, silicon nitride, and/or silicon oxynitride.

The organic encapsulation layer 420 covers the first inorganic encapsulation layer 410 and has a sufficient thickness, and an upper surface of the organic encapsulation layer 420 may be substantially flat over the entire display area DA (of FIG. 1). The organic encapsulation layer 420 may include at least one selected from the group consisting of polyethylene terephthalate ("PET"), polyethylene napthalene ("PEN"), polycarbonate ("PC"), PI, polyether sulfone ("PES"), polyoxymethylene ("POM"), polyarylate ("PAR"), and HMDSO.

The second inorganic encapsulation layer 430 covers the organic encapsulation layer 420 and may include silicon oxide, silicon nitride, and/or silicon oxynitride. The second inorganic encapsulation layer 430 extends outside the organic encapsulation layer 420 to contact the first inorganic encapsulation layer 410, such that the organic encapsulation layer 420 is not exposed to the outside.

In this manner, because the encapsulation layer 400 has a multilayer structure including the first inorganic encapsulation layer 410, the organic encapsulation layer 420, and the second inorganic encapsulation layer 430, even if cracks occur in the encapsulation layer 400, the cracks may not be connected to each other between the first inorganic encapsulation layer 410 and the organic encapsulation layer 420, or between the organic encapsulation layer 420 and the second inorganic encapsulation layer 430. In this manner, the formation of a penetration path of external moisture or oxygen into the display area DA (of FIG. 1) may be prevented or minimized.

According to embodiments of the disclosure, outgassing of organic matter may be minimized by reducing the volume of the organic matter in a display device. Therefore, even if the display device is exposed to sunlight for a long time, because decomposition of organic matter by sunlight can be prevented or minimized, reliability of the display device may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate comprising a display area and a peripheral area;
   a thin film transistor arranged on the substrate;
   a first metal wiring layer electrically connected to the thin film transistor;
   an inorganic protective layer on the first metal wiring layer;
   a patterned first organic film layer located on the inorganic protective layer and overlapping the first metal wiring layer in a plan view;
   a second metal wiring layer on the first organic film layer; and
   a second organic film layer on the second metal wiring layer,
   wherein the first organic film layer is patterned to be arranged at a position where the first metal wiring layer and the second metal wiring layer overlap each other in the plan view, and is not arranged on an entirety of the display area,
   the second organic film layer is arranged on the entire display area, and
   at least a portion of the second organic film layer contacts an upper surface of the inorganic protective layer.

2. The display device of claim 1, wherein the first metal wiring layer comprises a plurality of wires apart from each other.

3. The display device of claim 2, wherein the second organic film layer has a concave shape at a position in contact with the upper surface of the inorganic protective layer.

4. The display device of claim 1, further comprising: a light-emitting device electrically connected to the thin film transistor,
   wherein the light-emitting device comprises a pixel electrode, a common electrode, and an intermediate layer having a light-emitting layer between the pixel electrode and the common electrode,
   the pixel electrode is located on the second organic film layer, and
   the first organic film layer is arranged at a position to overlap the pixel electrode.

5. The display device of claim 4, further comprising: an encapsulation layer located on the common electrode and comprising a first inorganic encapsulation layer, an organic encapsulation layer, and a second inorganic encapsulation layer that are sequentially stacked.

6. The display device of claim 1, wherein the thin film transistor comprises a semiconductor layer and a gate electrode,
the first metal wiring layer comprises a scan line electrically connected to the gate electrode, and
the scan line is located in a different layer from a layer the gate electrode is located in.

7. The display device of claim 6, further comprising: a first insulating layer between the semiconductor layer and the gate electrode, and a second insulating layer and an interlayer insulating layer on the gate electrode,
wherein the scan line is located on the interlayer insulating layer.

8. The display device of claim 7, further comprising: an upper electrode having a storage capacitance and being arranged between the second insulating layer and the interlayer insulating layer at a position to overlap the gate electrode in the plan view.

9. The display device of claim 1, wherein the second metal wiring layer comprises a wire located directly on the inorganic protective layer exposed by the patterned first organic film layer.

10. The display device of claim 1, wherein the second metal wiring layer comprises a data line and a driving voltage line.

11. A display device comprising:
a substrate;
a thin film transistor arranged on the substrate;
a first metal wiring layer electrically connected to the thin film transistor;
a first organic film layer arranged to overlap the first metal wiring layer in a plan view;
a second metal wiring layer on the first organic film layer; and
a second organic film layer on the second metal wiring layer,
wherein the first metal wiring layer comprises a plurality of wires apart from each other, and
the second organic film layer has a concave shape between the plurality of wires and in an absence of a portion of the first organic film layer overlapping the concave shape of the second organic film layer in a top plan view.

12. The display device of claim 11, wherein the first metal wiring layer comprises a scan line, and
the first organic film layer is disposed to extend along the scan line.

13. The display device of claim 12, wherein the thin film transistor comprises a semiconductor layer and a gate electrode,
the scan line is electrically connected to the gate electrode, and
the scan line and the gate electrode are arranged in different layers from each other.

14. The display device of claim 13, further comprising: a first insulating layer between the semiconductor layer and the gate electrode, and a second insulating layer and an interlayer insulating layer on the gate electrode,
wherein the scan line is located on the interlayer insulating layer.

15. The display device of claim 14, further comprising: an upper electrode having a storage capacitance and being arranged between the second insulating layer and the interlayer insulating layer at a position to overlap the gate electrode in the plan view.

16. The display device of claim 11, further comprising: an inorganic protective layer on the first metal wiring layer,
wherein the first organic film layer is located on the inorganic protective layer, and
the second organic film layer contacts the upper surface of the inorganic protective layer according to the concave shape.

17. The display device of claim 16, wherein the second metal wiring layer comprises a wire located directly on the inorganic protective layer exposed by the patterned first organic film layer.

18. The display device of claim 11, further comprising: a light-emitting device electrically connected to the thin film transistor,
wherein the light-emitting device comprises a pixel electrode, a common electrode, and an intermediate layer having a light-emitting layer between the pixel electrode and the common electrode,
the pixel electrode is located on the second organic film layer, and
the first organic film layer is arranged at a position to overlap the pixel electrode.

19. The display device of claim 18, further comprising: an encapsulation layer located on the common electrode and comprising a first inorganic encapsulation layer, an organic encapsulation layer, and a second inorganic encapsulation layer that are sequentially stacked.

20. The display device of claim 11, wherein the second metal wiring layer comprises a data line and a driving voltage line.

* * * * *